(12) United States Patent
Chiu et al.

(10) Patent No.: US 9,786,818 B2
(45) Date of Patent: Oct. 10, 2017

(54) LIGHT EMITTING DIODE AND METHOD FOR MANUFACTURING THE SAME

(71) Applicant: ADVANCED OPTOELECTRONIC TECHNOLOGY, INC., Hsinchu Hsien (TW)

(72) Inventors: Ching-Hsueh Chiu, Hsinchu (TW); Chia-Hung Huang, Hsinchu (TW); Ya-Wen Lin, Hsinchu (TW); Po-Min Tu, Hsinchu (TW); Shih-Cheng Huang, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/823,129

(22) Filed: Aug. 11, 2015

(65) Prior Publication Data

US 2016/0064613 A1    Mar. 3, 2016

(30) Foreign Application Priority Data

Sep. 2, 2014    (CN) .......................... 2014 1 0441937

(51) Int. Cl.
| | | |
|---|---|---|
| H01L 31/00 | (2006.01) |
| H01L 33/40 | (2010.01) |
| H01L 33/38 | (2010.01) |
| H01L 33/00 | (2010.01) |
| H01L 33/32 | (2010.01) |
| H01L 33/44 | (2010.01) |

(52) U.S. Cl.
CPC .......... *H01L 33/405* (2013.01); *H01L 33/385* (2013.01); *H01L 33/0095* (2013.01); *H01L 33/32* (2013.01); *H01L 33/44* (2013.01); *H01L 2933/0016* (2013.01)

(58) Field of Classification Search
CPC ......... H01L 2933/0016; H01L 33/0095; H01L 33/385; H01L 33/405; H01L 33/44; H01L 33/382; H01L 33/387
See application file for complete search history.

(56) References Cited

U.S. PATENT DOCUMENTS

| | | | | |
|---|---|---|---|---|
| 2011/0220931 A1* | 9/2011 | Kojima | .................... | H01L 33/20 257/98 |
| 2011/0272666 A1* | 11/2011 | Hung | ...................... | H01L 33/22 257/13 |
| 2011/0284910 A1* | 11/2011 | Iduka | .................... | H01L 33/385 257/99 |
| 2013/0181249 A1* | 7/2013 | Aoyagi | .................. | H01L 33/62 257/99 |

(Continued)

*Primary Examiner* — Trung Q Dang
*Assistant Examiner* — Frederick B Hargrove
(74) *Attorney, Agent, or Firm* — Steven Reiss

(57) ABSTRACT

A light emitting diode includes a first electrode, a second electrode and an epitaxial structure. The epitaxial structure is arranged on the first electrode, and electrically connects with the first electrode and the second electrode. The second electrode surrounds periphery of the epitaxial structure to reflect light from the epitaxial structure to emit out from the top of the epitaxial structure. This disclosure also relates to a method for manufacturing the light emitting diode. The light emitting diode and the method help solve the problem of low light efficiency of the light emitting diode.

7 Claims, 15 Drawing Sheets

(56) References Cited

U.S. PATENT DOCUMENTS

2014/0231851 A1\* 8/2014 Tsai ..................... H01L 33/385
  257/98
2015/0179873 A1\* 6/2015 Wunderer ............... H01L 33/32
  257/13

\* cited by examiner

LIGHT EMITTING DIODE AND METHOD FOR MANUFACTURING THE SAME

FIELD

The subject matter relates to semiconductor structures, and particularly relates to a light emitting diode and manufacturing method thereof.

BACKGROUND

A traditional light emitting diode includes a light transmission substrate, an N-type semiconductor layer, an active layer, a P-type semiconductor layer, a P-type electrode and an N-type electrode. The P-type electrode is arranged on a surface of the P-type semiconductor layer and the N-type electrode is arranged on a surface of the N-type semiconductor layer. Part of light emitted from the active layer is reflected by the N-type electrode and the P-type electrode, which will reduce light efficiency thereof.

BRIEF DESCRIPTION OF THE DRAWINGS

Implementations of the present technology will now be described, by way of example only, with reference to the attached figures.

DETAILED DESCRIPTION

Figure 1:
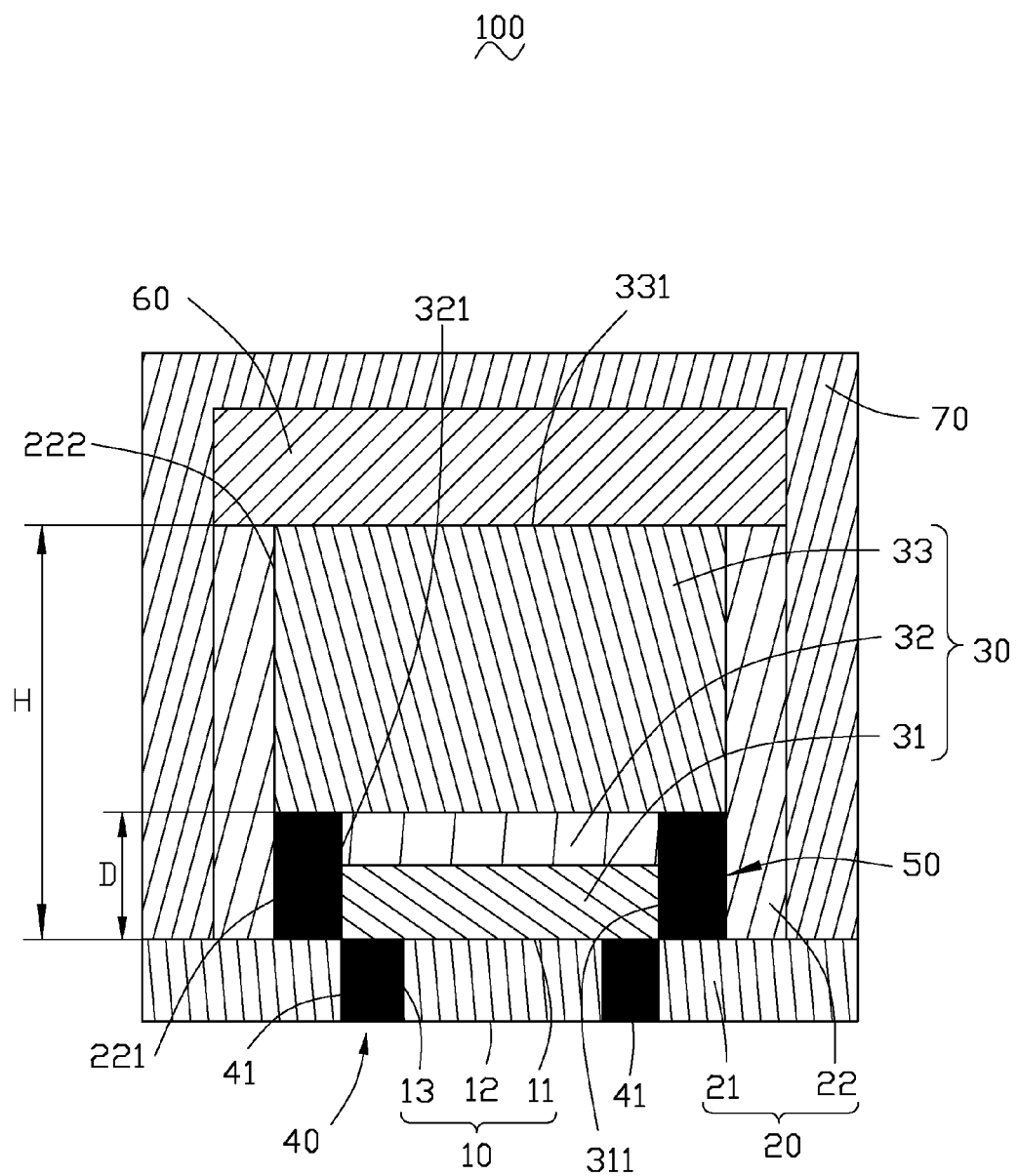
FIG. 1 is a cross-section view of a light emitting diode in accordance with a first exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

FIG. 1 shows a light emitting diode 100 of a first embodiment in the present disclosure.

Referring to FIG. 1, the light emitting diode 100 in the first embodiment includes a first electrode 10, a second electrode 20 and an epitaxial structure 30. The epitaxial structure 30 is arranged on the first electrode 10. The epitaxial structure 30 is electrically connected to the first electrode 10 and the second electrode 20 respectively. The second electrode 20 surrounds periphery of the epitaxial structure 30 and materials with reflecting property can be coated on inner surfaces of the second electrode 20 to reflect light emitted from the epitaxial structure 30 to emit out from top of the epitaxial structure 30.

The first electrode 10 includes a top surface 11, a bottom surface 12 opposite to the top surface 11 and side surfaces 13. Each side surface 13 connects the top surface 11 to the bottom surface 12. The first electrode 10 has a reflecting property to reflect light. Preferably, the first electrode 10 is made of Cr or Au or materials with reflecting property are coated on the top surface 11 of the first electrode 10.

The epitaxial structure 30 is arranged on the top surface 11 of the first electrode 10. A diameter of the epitaxial structure 30 is larger than the diameter of the first electrode 10. The bottom of the epitaxial structure 30 is directly attached on the top surface 11 of the first electrode 10 to be electrically connected to the first electrode 10. The periphery of the epitaxial structure 30 extends over the side surfaces 13 of the first electrode 10. A vertical cross-section of the first electrode 10 and the epitaxial structure 30 is shaped as a letter T.

The epitaxial structure 30 includes a first semiconductor layer 31, an active layer 32 and a second semiconductor layer 33. The first semiconductor layer 31, the active layer 32 and the second semiconductor layer 33 are arranged on the first electrode 10 that order. The first semiconductor layer 31 is directly attached on the top surface 11 of the first electrode 10 to electrically connect the epitaxial structure 30 to the first electrode 10. In this exemplary embodiment, the first semiconductor layer 31 is a P—GaN layer, the active layer 32 is a multiple quantum wells (MQWs) layer, and the second semiconductor layer 33 is an N—GaN layer.

The second electrode 20 includes a base 21 and an extension 22. The extension 22 extends upwardly from the top of the base 21. In this exemplary embodiment, the first electrode 10 is surrounded by the base 21, and the periphery of the epitaxial structure 30 is surrounded by the extension 22.

A width of the base 21 is greater than the width of the extension 22. In this exemplary embodiment, the extension 22 remains an identical height. A thickness of the base 21 is almost the same as the thickness of the first electrode 10. Preferably, the top surface of the base 21 and the top surface 11 of the electrode 10 are coplanar, and the bottom surface of the base 21 and the bottom surface 12 of the electrode 10 are coplanar.

The base 21 and the first electrode 10 are spaced apart from each other, and a first annular groove 40 is defined therebetween. Preferably, the first annular groove 40 is filled with an insulating layer 41. The insulating layer 41 can be $SiO_2$, $SiN_x$ or SU-8 resin. Preferably, the insulating layer 41 is $SiO_2$. Materials with reflecting property are coated on surfaces of the insulating layer 41 to reflect light.

The extension 22 extends upwardly along the periphery of the epitaxial structure 30. The whole periphery of the epitaxial structure 30 is surrounded by the extension 22. A bottom inner edge 221 of the extended 22 is spaced apart from the first semiconductor layer 31 and the active layer 32, therewith a second annular groove 50 defined. The second annular groove 50 is surrounded by the bottom inner edge 221 of the extension 22, a peripheral lateral surface 311 of the first semiconductor layer 31 and a peripheral lateral surface 321 of the active layer 32. Preferably, the second annular groove 50 is filled with the insulating layer 41.

The second annular groove 50 is defined between the top surface of second electrode 20 and the bottom surface of the second semiconductor layer 33. Preferably, a depth D of the second annular groove 50 is equal to a sum of depths of the first semiconductor layer 31 and the active layer 32. In other exemplary embodiments, the depth D of the second annular groove 50 can be larger than the sum of depths of the first semiconductor layer 31 and the active layer 33, but smaller than a height H of the epitaxial structure 30.

The top inner edge 222 of the extension 22 directly contacts the second semiconductor layer 33 to electrically connect the second electrode 20 to the epitaxial structure 30. Preferably, a height of the extension 22 extending upwardly from the top of the base 21 is equal to the height H of the epitaxial structure 30, therewith the top surface of the extension 22 and an outside surface 331 of the second semiconductor layer 33 being coplanar. In this exemplary embodiment, the outside surface 331 of the second semiconductor layer 33 is a top emitting surface of the light emitting diode 100.

Because the first electrode 10 of the light emitting diode 100 in the present disclosure is located at the bottom of the epitaxial structure 30 and the periphery of the epitaxial structure 30 is surrounded by the second electrode 20, medial light emitted from the epitaxial structure 30 emits out from top of the epitaxial structure 30 directly, and side light emitted from the epitaxial structure 30 is reflected by the second electrode 20 to emit out from top of the epitaxial structure 30, thereby better light efficiency of the light emitting diode 100 obtained.

Additionally, the first annular groove 40 and the second annular groove 50 are respectively filled with the insulating layers 41. Light emitting to the bottom of the epitaxial structure 30 is reflected by the insulating layers 41 to emit out from top of the epitaxial structure 30. So the light is prevented from being emitted out from the second annular groove 50, but is allowed to be emitted out from the top of the epitaxial structure 30, thereby improving light efficiency.

The light emitting diode 100 can also include a light transmission layer 60. In this exemplary embodiment, the light transmission layer 60 is configured on top of the extension 22 and the outside surface 331 of the second semiconductor layer 33. The light transmission layer 60 covers the top of the extension 22 and the outside surface 331 of the second semiconductor layer 33. The light transmission layer 60 is made of materials with good light transmission properties. The light transmission layer 60 can protect the epitaxial structure 30 from moisture and dust and enhance mechanical strength. In this exemplary embodiment, the light transmission layer 60 can be a sapphire substrate.

The light emitting diode 100 can further include a protective layer 70. The protective layer 70 is extended from the top surface of the base 21 and along the periphery of the extension 22 of the second electrode 20. The protective layer 70 encloses the extension 22 and the light transmission layer 60.

The protective layer 70 is made of materials with good thermal conductivity and good light transmission properties. The protective layer 70 protects the light transmission layer 60 and the extension 22 of the second electrode 20 and enhances mechanical strength of the whole light emitting diode 100. Heat generated from the epitaxial structure 30 can be transferred by the extension 22 of the second electrode 20 to the protective layer 70. So the protective layer 70 also has a good advantage in dissipating heat.

Figure 2:
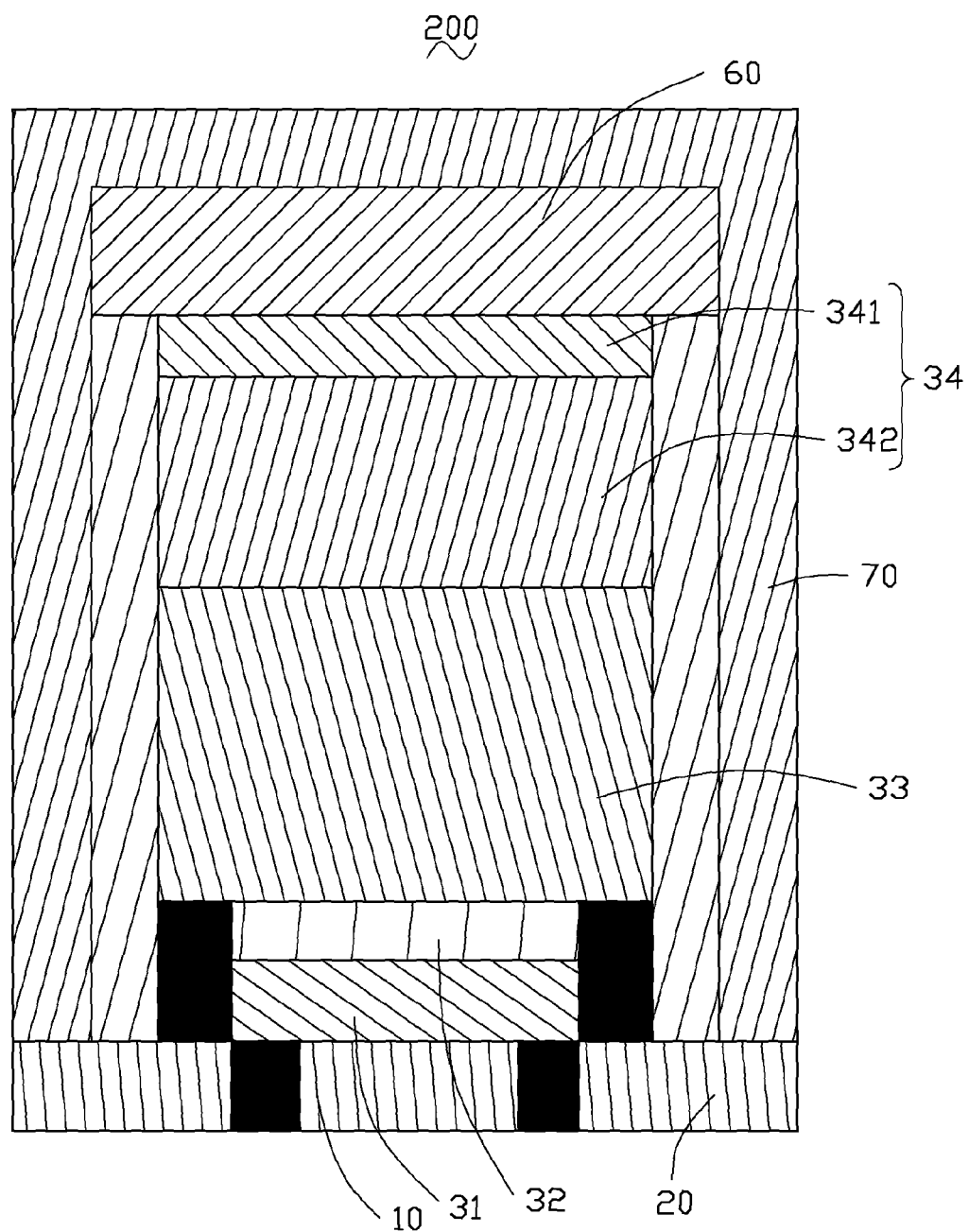
FIG. 2 is a cross-section view of a light emitting diode in accordance with a second exemplary embodiment of the present disclosure.

FIG. 2 shows a light emitting diode 200 of a second embodiment in the present disclosure.

Referring to FIG. 2, compared with the light emitting diode 100 of the first embodiment, a difference therebetween is that the epitaxial structure 30 of the light emitting diode 200 of the second embodiment further includes a buffer layer 34. The buffer layer 34 is formed between the light transmission layer 60 and the second semiconductor layer 33. The buffer layer 34 further includes a cryo unalloyed GaN layer 341 and a pyro unalloyed GaN layer 342. The pyro unalloyed GaN layer 342 and the cryo unalloyed GaN layer 341 are configured on the second semiconductor layer 33 that order.

A method for manufacturing a light emitting diode is also provided in the present disclosure.

Referring from FIG. 3 to FIG. 15, the method for manufacturing the light emitting diode includes:

growing an epitaxial layer 20b on a light transmission substrate 10b; the epitaxial layer 20b comprising at least a first semiconductor layer 21b, an active layer 22b and a second semiconductor layer 23b that order from the top down;

defining a plurality of annular pits 301b on the epitaxial layer 20b; each annular pit 301b penetrating through at least the first semiconductor layer 21b and the active layer 22b;

filling each annular pit 301b with a corresponding insulating layer 40b;

forming a plurality of individual epitaxial structures 100b by etching parts of the epitaxial layer 20b surrounding periphery of the annular pits 301b; the epitaxial structures 100b being spaced apart from each other and a corresponding channel 50b being defined therebetween;

forming a plurality of conductive layers 60b in the channels 50b to be the second electrode 400b; each conductive layer 60b covering periphery of a corresponding epitaxial structure 100b;

dividing the light transmission substrate 10b to form a plurality of separate epitaxial structures 100b;

forming a first electrode 300b to form a light emitting diode 500.

Figure 3:
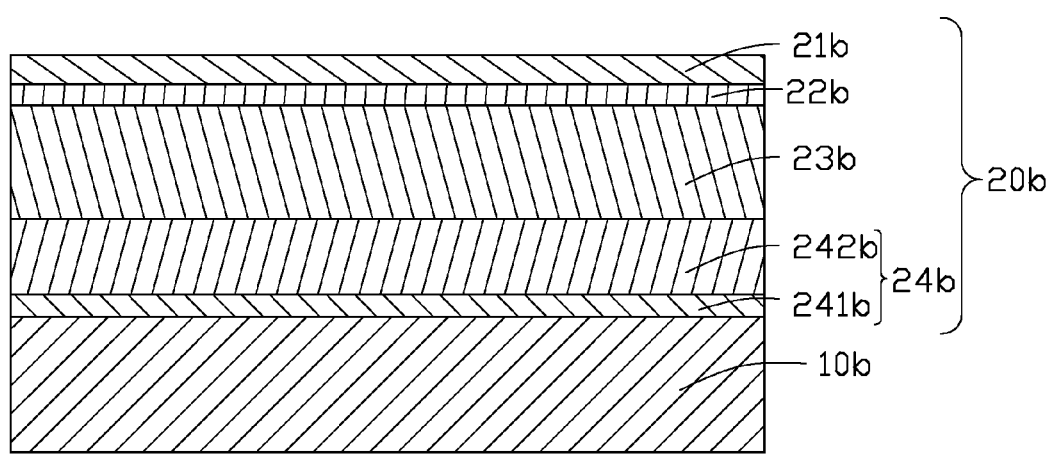
FIGS. 3-15 are cross-sectional views showing semi-finished light emitting diodes processed by different steps of a method for manufacturing an light emitting diode accordance with an embodiment of the present disclosure.

Referring to FIG. 3, an epitaxial layer 20b is grown on a light transmission substrate 10b. The epitaxial layer 20b includes at least a first semiconductor layer 21b, an active layer 22b and a second semiconductor layer 23b that order from the top down. In this exemplary embodiment, the epitaxial layer 20b can further include a buffer layer 24b. The buffer layer 24b is configured between the light transmission substrate 10b and the second semiconductor layer 23b to raise the grown quantity of the epitaxial layer 20b. Preferably, the buffer layer 24b includes a cryo unalloyed GaN layer 241b and a pyro unalloyed GaN layer 242b. The cryo unalloyed GaN layer 241b is grown on the light transmission substrate 10b and the pyro unalloyed GaN layer 242b is grown on the cryo unalloyed GaN layer 241b. In this exemplary embodiment, the first semiconductor layer 21b is a P—GaN layer, the active layer 22b is a multiple quantum wells (MQWs) layer, and the second semiconductor layer 23b is an N—GaN layer.

Figure 4:
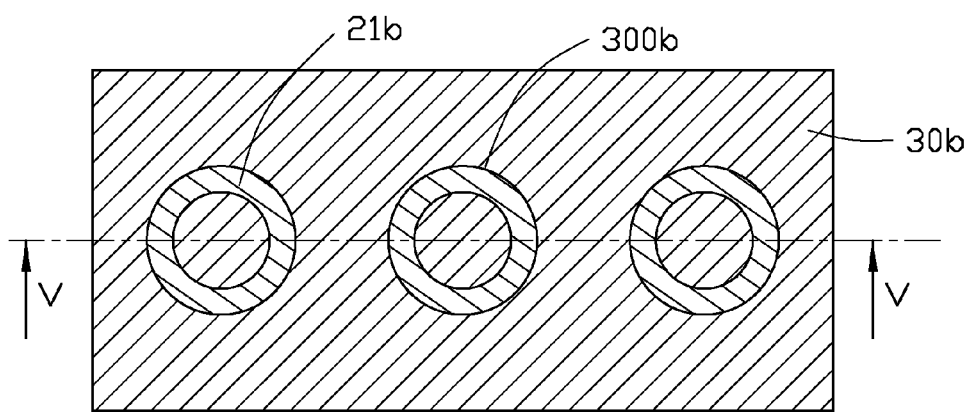
Figure 5:
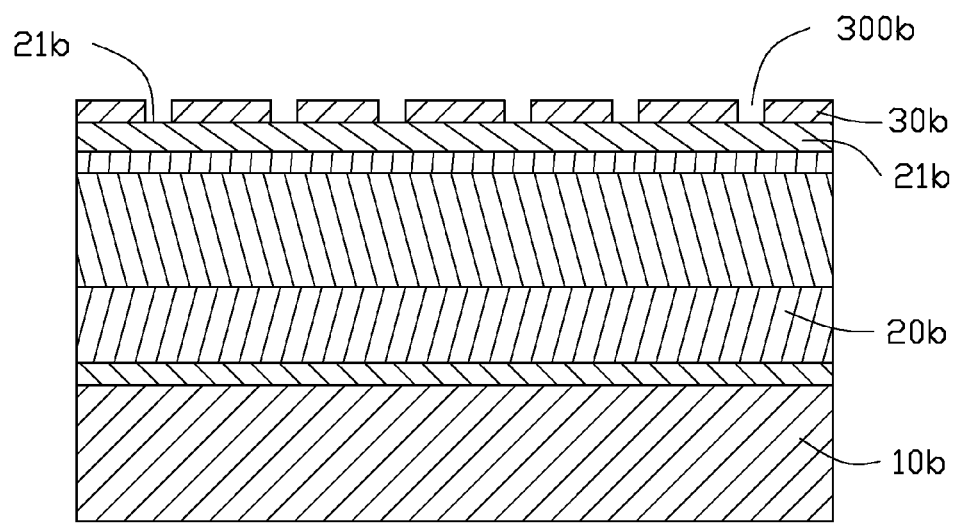
Figure 6:
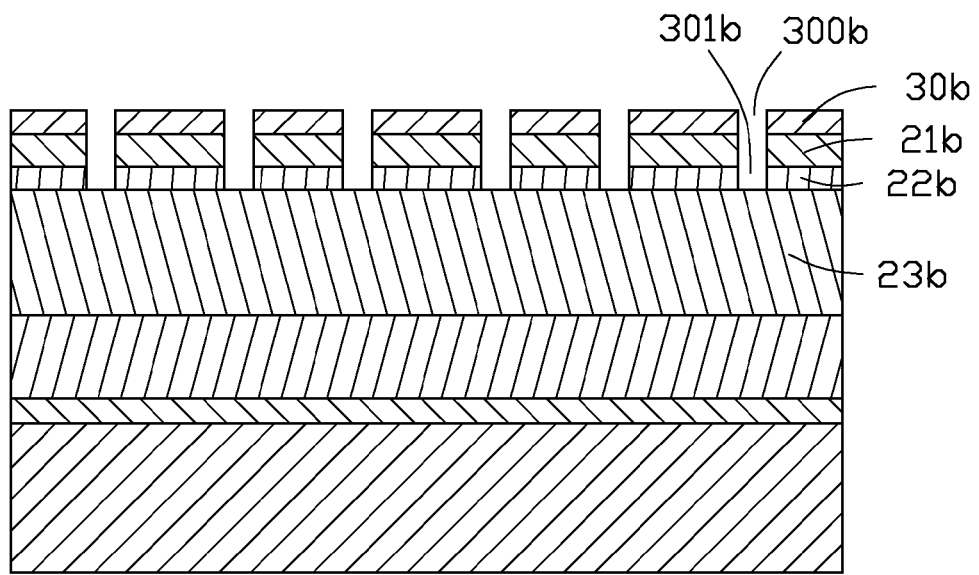

Referring from FIG. 4 to FIG. 6, a plurality of annular pits 301b are defined on the epitaxial layer 20b. Each annular pit 301b penetrates in at least the first semiconductor layer 21b and the active layer 22b.

Preferably, forming the annular pits 301b includes:

A photoresist layer 30b is formed on the epitaxial layer 20b. Several through holes 300b are defined on the photoresist layer 30b. The through holes 300b are spaced apart from each other. In this exemplary embodiment, each through hole 300b is ring-shaped. Part surface of the first semiconductor layer 21b of the epitaxial layer 20b is exposed by the through holes 300b. The photoresist layer 30b is negative photoresist. The photoresist layer 30b can be made of polyisoprene.

The epitaxial layer 20b is etched downward along the through holes 300b to form the annular pits 301b. Each annular pit 301b connects to a corresponding through hole 300b. Each annular pit 301b is extended downward in height direction of the epitaxial layer 20b. Each annular pit 301b penetrates through the photoresist layer 30b, the first semiconductor layer 21b and the active layer 22b to expose the second semiconductor layer 23b.

Figure 7:
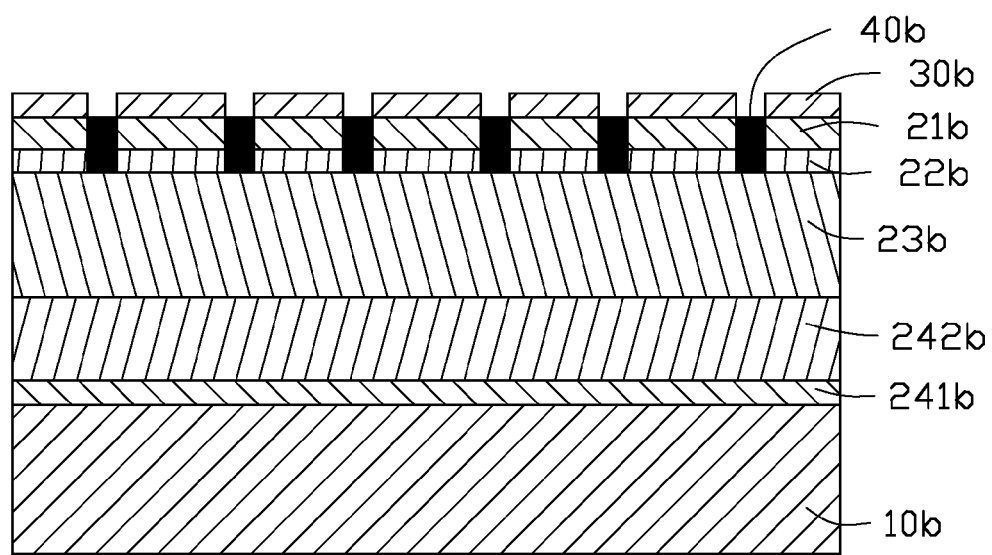

Referring to FIG. 7, each annular pit 301b is filled with a corresponding insulating layer 40b. Preferably, the insulating layer 40b is introduced as $SiO_2$.

Figure 8:
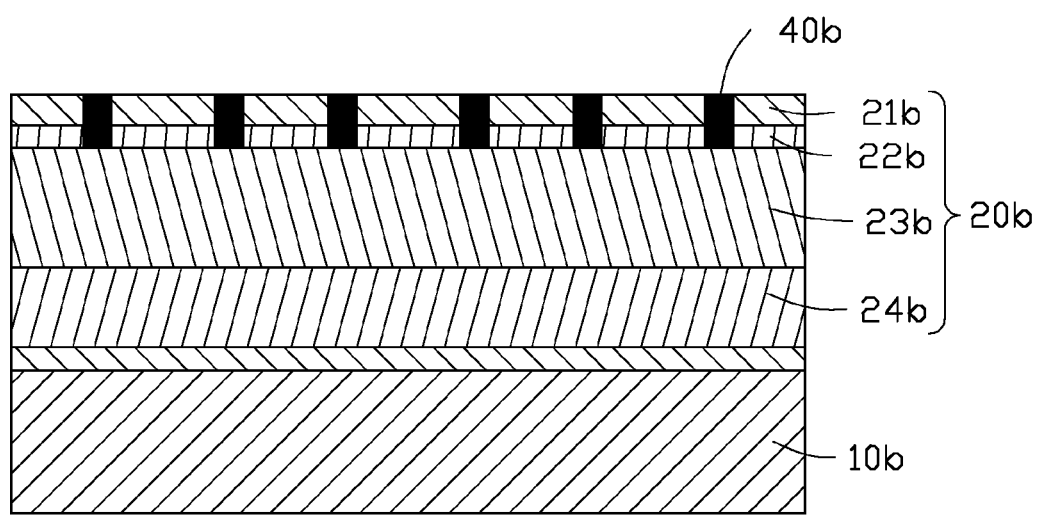
Figure 9:
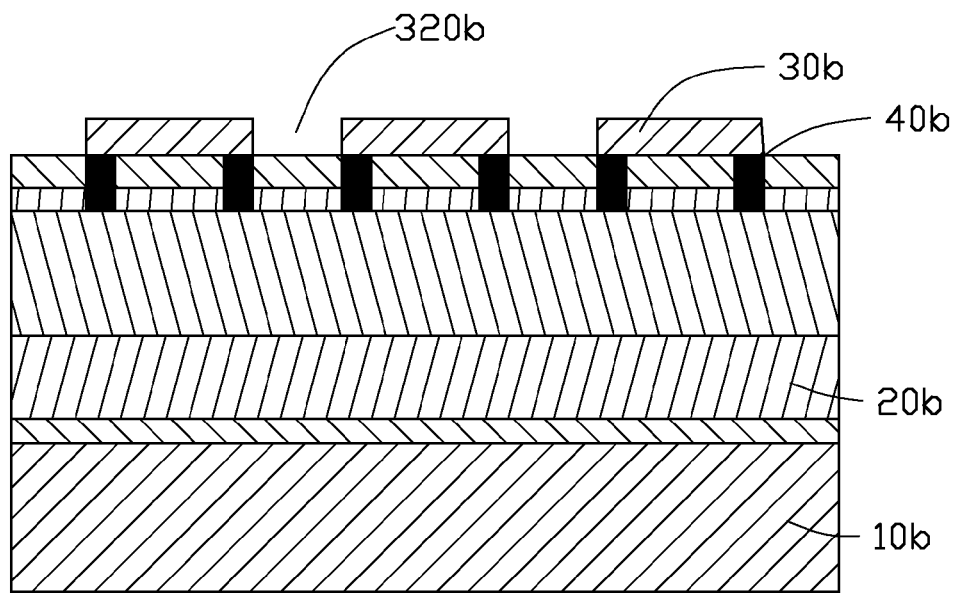
Figure 10:
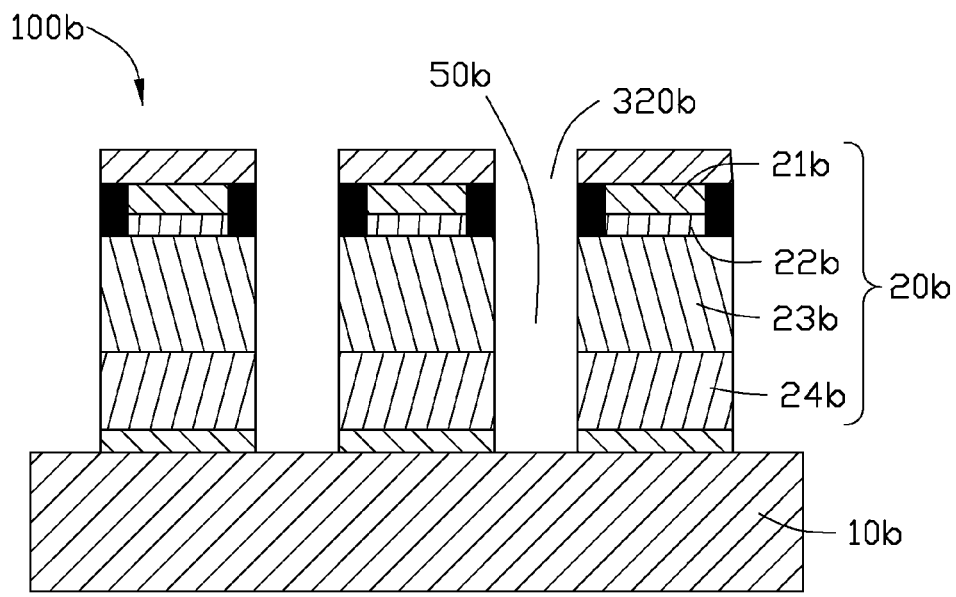

Referring from FIG. 8 to FIG. 10, a plurality of epitaxial structures 100b are formed by etching parts of the epitaxial layer 20b surrounding periphery of the annular pits 301b. The epitaxial structures 100b are spaced apart from each other and a corresponding channel 50b is defined therebetween.

Preferably, forming the channels 50b includes:

Referring to FIG. 8, the photoresist layer 30b is removed.

Referring to FIG. 9, a plurality of new photoresist layers 30b are formed on the epitaxial structures 100b. Each photoresist layer 30b covers a corresponding insulating layer 40b and parts of the epitaxial layer 20b surrounded by the corresponding insulating layer 40b. A corresponding spacer region 320b is defined between two adjacent photoresist layers 30b. In this exemplary embodiment, each spacer region 320b is ring-shaped.

Referring to FIG. 10, the epitaxial structures 100b are formed by etching the epitaxial layer 20b downward along the spacer regions 320b. Each channel 50b is defined between two adjacent epitaxial structures 100b. Each channel 50b is ring-shaped.

In this exemplary embodiment, each channel 50b penetrates through the first semiconductor layer 21b, the active layer 22b, the second semiconductor layer 23b and the buffer layer 24b to bottom of the channels 50b.

Figure 11:
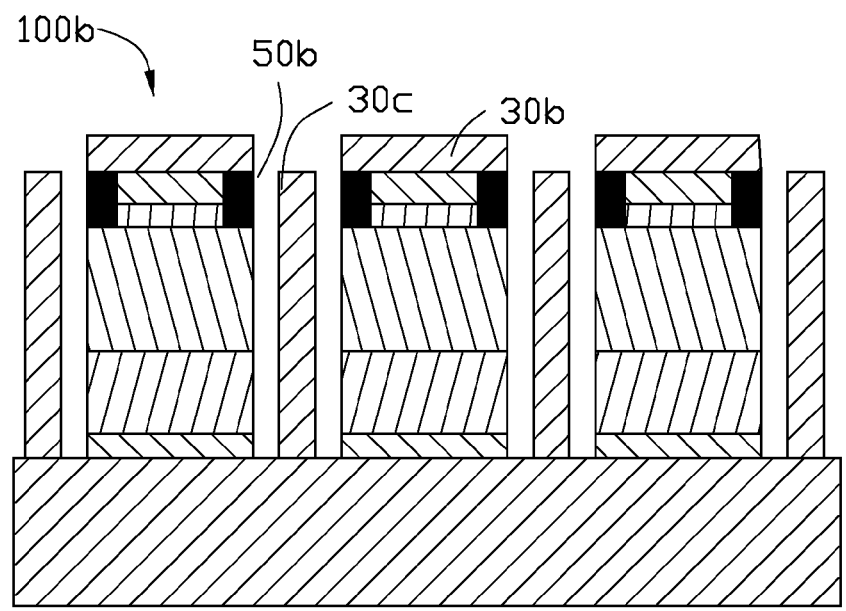
Figure 12:
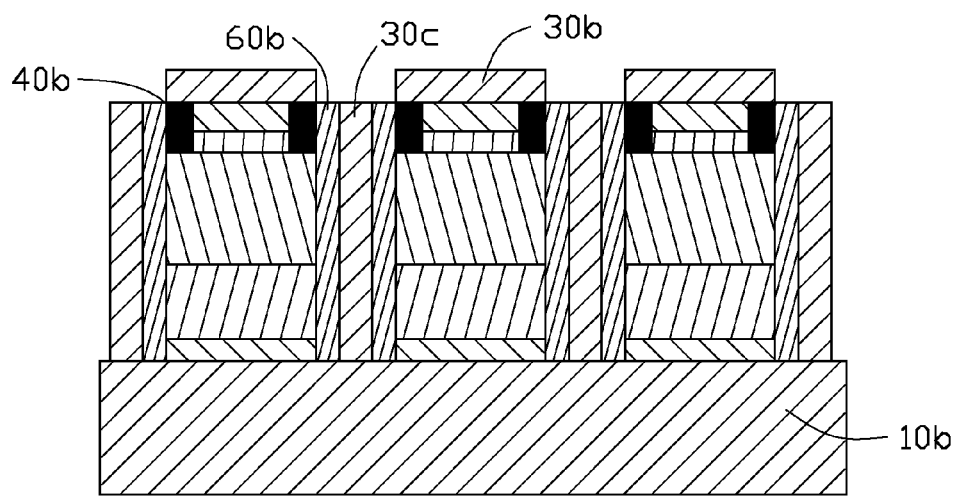

Referring from FIG. 11 to FIG. 12, a plurality of conductive layers 60b are formed in the channels 50b. Each conductive layer 60b covers periphery of a corresponding epitaxial structure 100b.

Preferably, forming the conductive layers 60b includes:

Referring to FIG. 11, a plurality of photoresist layers 30c are formed in the channels 50b. Each epitaxial structure 100b is surrounded by a corresponding photoresist layer 30c. Each photoresist layer 30c is spaced apart from a corresponding epitaxial structure 100b. Preferably, a height of the photoresist layer 30c is equal to that of the corresponding epitaxial structure 100b. In this exemplary embodiment, material composing the photoresist layers 30c is the same with material composing the photoresist layers 30b.

Referring to FIG. 12, each conductive layer 60b is formed between the corresponding photoresist layer 30c and periphery of the corresponding epitaxial structure 100b. Each conductive layer 60b covers the periphery of the corresponding epitaxial structures 100b and periphery of a corresponding insulating layer 40b. Preferably, a height of each conductive layer 60b is equal to that of the corresponding epitaxial structure 100b.

Figure 13:
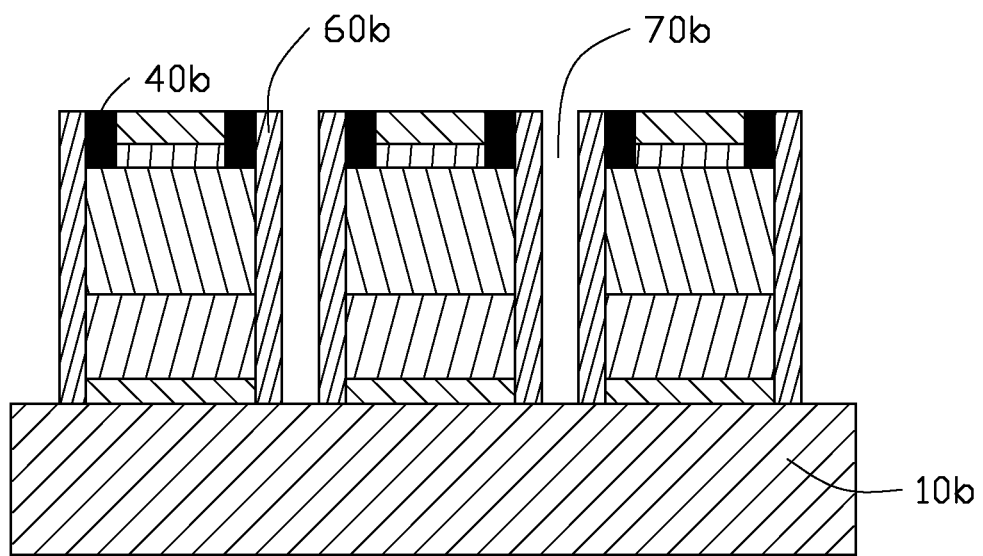
Figure 14:
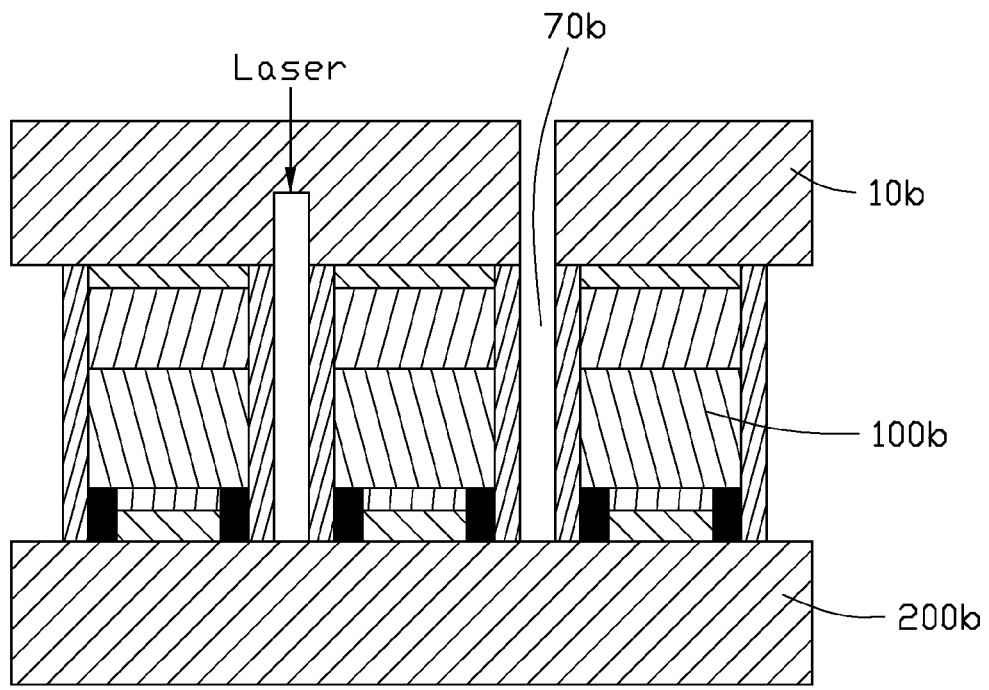

Referring to FIG. 13 to FIG. 14, the light transmission substrate 10b is divided to form a plurality of separate epitaxial structures 100.

Forming the separate epitaxial structures 100 includes:

Referring to FIG. 13, the photoresist layers 30b and 30c are removed to form a gap 70b between two adjacent epitaxial structures 100.

Referring to FIG. 14, the epitaxial structures 100 are separated by cutting the light transmission substrate 10b. In detail, the epitaxial structures 100 are reversed and the light transmission substrate 10b can be cut along the gaps 70b by laser light. In detail, the light transmission substrate 10b is cut by laser light after the epitaxial structures 100 being reversed and placed on a blue adhesive tape 200b.

Figure 15:
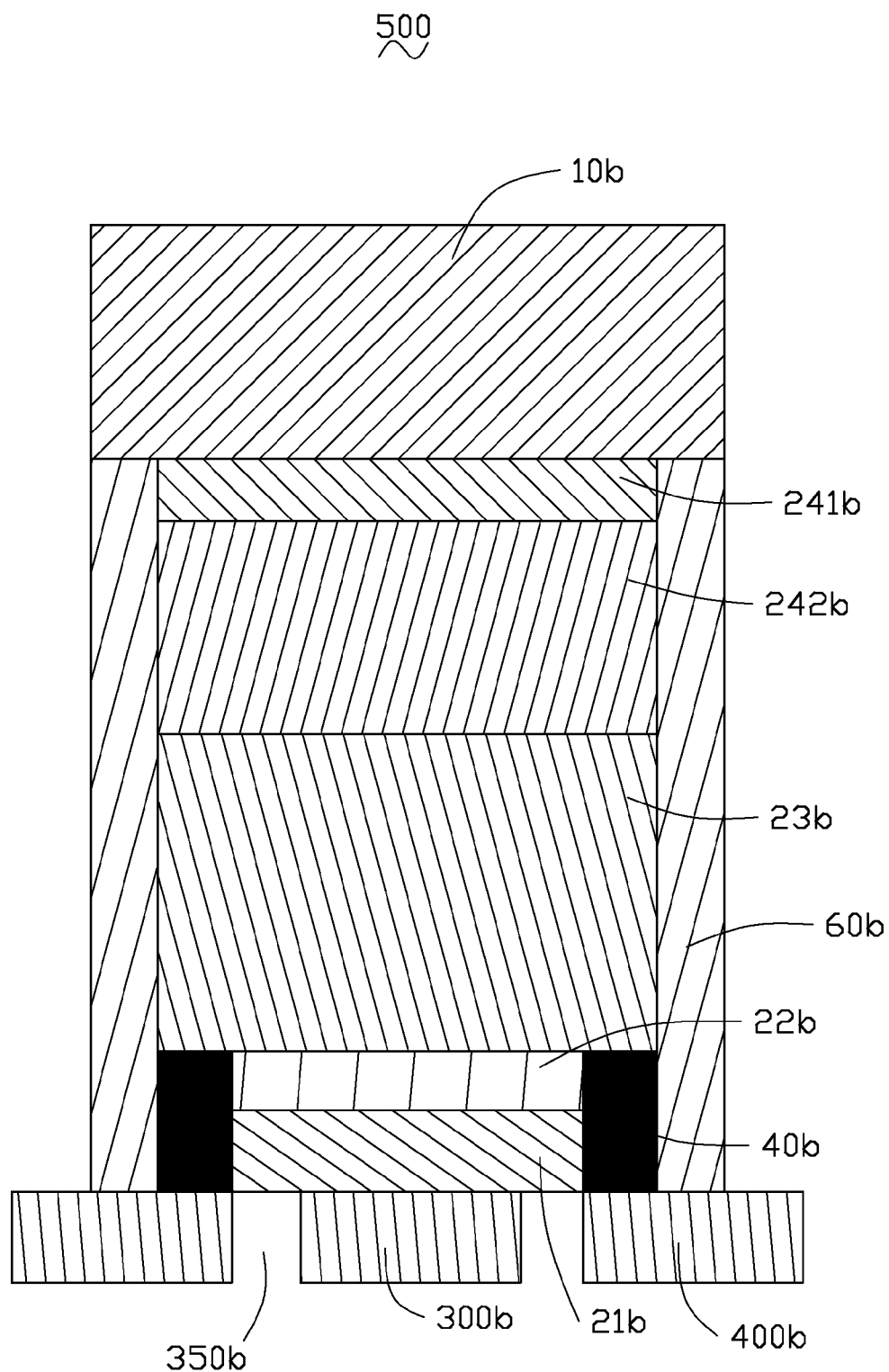

Referring to FIG. 15, a first electrode 300b and a second electrode 400b are formed to form a light emitting diode 500.

Configuring the first electrode 300b and the second electrode 400b includes:

A metal layer is configured under the first semiconductor layer 21b to form the first electrode 300b. In some embodiments, the conductive layer 60b can be the second electrode 400b. In this exemplary embodiment, another metal layer is configured under the conductive layer 60b. The metal layer and the conductive layer 60b are coupled to be the second electrode 400b.

Preferably, an annular slot 350b is formed between the first electrode 300b and the second electrode 400b. The annular slot 350 can be filled with the insulted layer 40b. The insulted layer 40b is introduced as SiO2.

The method for manufacturing the light emitting diode further may include: forming a protective layer 70 (referring to FIG. 2). The protective layer 70 is located outside of the light emitting diode 500. The protective layer 70 encloses the light transmission substrate 10b and the conductive layer 60b. The protective layer 70 is made of materials with good thermal conductivity and good light transmission properties. Preferably, the protective layer 70 is made of AlN.

In the process of manufacturing the light emitting diode, because the second electrode 20/400b surrounds the periphery of the epitaxial structures 30/100b, side light from the epitaxial structure 30/100b is reflected by the second electrode 20/400b to emit out from the top of the light emitting diode 100/200/500, thereby improving light efficiency of the light emitting diode 100/200/500.

The embodiment shown and described above is only an example. Many details are often found in the art such as the other features of the light emitting diode. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A light emitting diode, comprising:
   a first electrode having a top surface,
   a second electrode comprising a base and an extension, the base having a top surface, the extension extending upward from the top surface of the base, the base surrounding and being spaced apart from periphery lateral surface of the first electrode to define a first annular groove, and
   an epitaxial structure arranged on the first electrode and electrically connected to the first electrode and the second electrode, the epitaxial structure comprising a first semiconductor layer, an active layer, and a second semiconductor layer stacked together on the top surface of the first electrode;

wherein the extension fully surrounds periphery lateral surface of the first semiconductor layer, the active layer, and the second semiconductor layer to reflect light emitted from the epitaxial structure to emit out from top of the epitaxial structure, a bottom inner edge of the extension is spaced apart from the periphery lateral surface of the first semiconductor layer and the periphery lateral surface of the active layer to define a second annular groove, the second annular groove is defined between the top surface of the base and a bottom surface of the second semiconductor layer, a top inner edge of the extension directly contacts the periphery lateral surface of the second semiconductor layer.

2. The light emitting diode of claim 1, wherein the first semiconductor layer directly contacts with the top surface of the first electrode and is electrically connected to the first electrode, and the second semiconductor layer is electrically connected to the second electrode.

3. The light emitting diode of claim 1, wherein the first annular groove is filled with insulating materials.

4. The light emitting diode of claim 1, wherein the second annular groove is filled with insulating materials.

5. The light emitting diode of claim 1, further comprising a light transmission layer, wherein the light transmission layer is formed on top of the extension and an outside surface of the second semiconductor layer.

6. The light emitting diode of claim 5, further comprising a protective layer, wherein the protective layer extends from top surface of the base and along periphery lateral surface of the extension of the second electrode.

7. The light emitting diode of claim 6, further comprising a buffer layer, wherein the buffer layer is formed between the light transmission layer and the second semiconductor layer.

* * * * *